(12) United States Patent
Yokoi et al.

(10) Patent No.: US 8,048,749 B2
(45) Date of Patent: Nov. 1, 2011

(54) METHOD FOR MANUFACTURING SEMICONDUCTOR DEVICE

(75) Inventors: Tomokazu Yokoi, Kanagawa (JP); Atsuo Isobe, Kanagawa (JP); Motomu Kurata, Kanagawa (JP); Takeshi Shichi, Kanagawa (JP); Daisuke Ohgarane, Kanagawa (JP); Takashi Shingu, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 364 days.

(21) Appl. No.: 12/178,356

(22) Filed: Jul. 23, 2008

(65) Prior Publication Data

US 2009/0029514 A1    Jan. 29, 2009

(30) Foreign Application Priority Data

Jul. 26, 2007    (JP) .................. 2007-194093

(51) Int. Cl.
H01L 21/336 (2006.01)
(52) U.S. Cl. .. 438/293; 438/149; 438/151; 257/E21.409
(58) Field of Classification Search .................. 438/149, 438/151, 293
See application file for complete search history.

(56) References Cited

U.S. PATENT DOCUMENTS

| | | | |
|---|---|---|---|
| 5,498,904 A | 3/1996 | Harata et al. | |
| 5,656,825 A | 8/1997 | Kusumoto et al. | |
| 6,335,232 B1 | 1/2002 | Ohori et al. | |
| 6,653,657 B2 | 11/2003 | Kawasaki et al. | |
| 6,841,797 B2 | 1/2005 | Isobe et al. | |
| 6,911,358 B2 | 6/2005 | Azami et al. | |
| 6,933,527 B2 | 8/2005 | Isobe et al. | |
| 7,105,392 B2 | 9/2006 | Isobe et al. | |
| 7,115,903 B2 | 10/2006 | Isobe et al. | |
| 7,148,092 B2 | 12/2006 | Isobe et al. | |
| 7,189,997 B2 | 3/2007 | Tsunoda et al. | |
| 7,238,557 B2 | 7/2007 | Hayakawa | |

(Continued)

FOREIGN PATENT DOCUMENTS

JP    61-048975    3/1986

(Continued)

OTHER PUBLICATIONS

He et al., "Raised Source and Drain Structure of Poly-Si TFTs", Electrochemical Society Proceedings, vol. 98-22, pp. 204-220 (1998).

(Continued)

*Primary Examiner* — Alexander Ghyka
(74) *Attorney, Agent, or Firm* — Nixon Peabody LLP; Jeffrey L. Costellia

(57) ABSTRACT

A method for manufacturing a semiconductor device, by which a bottom gate thin film transistor that has an improved S value and a channel forming region with a smaller thickness than that of a source region and a drain region can be manufactured in a simple process. An island-like conductive film is formed over a surface of an insulating substrate in a portion corresponding to a channel forming region, and is covered with an insulating film to form a projection portion. After an amorphous semiconductor film is deposited to cover the projection portion, the amorphous semiconductor film is irradiated with laser light so as to be melted and crystallized. Part of the melted semiconductor over the projection portion flows into regions adjacent to both sides of the projection portion, which results in reduction in thickness of the semiconductor film over the projection portion (channel forming region).

13 Claims, 14 Drawing Sheets

U.S. PATENT DOCUMENTS

| | | |
|---|---|---|
| 7,259,045 B2 | 8/2007 | Dejima |
| 7,312,473 B2 | 12/2007 | Koyama et al. |
| 2003/0218171 A1* | 11/2003 | Isobe et al. ............ 257/64 |
| 2007/0015323 A1 | 1/2007 | Isobe et al. |
| 2007/0085080 A1 | 4/2007 | Isobe et al. |

FOREIGN PATENT DOCUMENTS

| | | |
|---|---|---|
| JP | 02-076264 | 3/1990 |
| JP | 05-013762 | 1/1993 |
| JP | 05-110099 | 4/1993 |
| JP | 05-198594 | 8/1993 |
| JP | 09-036376 | 2/1997 |
| JP | 11-111998 | 4/1999 |
| JP | 2003-203920 | 7/2003 |
| JP | 2004-281687 | 10/2004 |

OTHER PUBLICATIONS

He et al., "Raised Source and Drain Structure of Poly-Si TFTs", Electrochemical Society Proceedings, (1999), vol. 98-22, pp. 204-220.

* cited by examiner

METHOD FOR MANUFACTURING SEMICONDUCTOR DEVICE

BACKGROUND OF THE INVENTION

1. Field of the Invention

The present invention relates to a method for manufacturing a semiconductor device. In particular, the invention relates to a method for manufacturing a bottom gate thin film transistor that includes a channel forming region having a thickness smaller than that of a source region and a drain region.

2. Description of the Related Art

It is known that in a thin film transistor (hereinafter referred to as a TFT), the S value that indicates the switching characteristics (subthreshold characteristics) of a transistor can be improved (i.e., reduced) by reducing the thickness of a channel forming region. The S value here is a gate voltage (potential difference between a source region and a gate electrode based on the potential of the source region) that is required to increase a current between the source region and a drain region (subthreshold current) by one digit. When the S value decreases, the slope of the subthreshold current to the gate voltage increases and excellent switching characteristics are obtained. A TFT with a smaller S value is advantageous in that power consumption is suppressed by reducing the operating voltage and the off leak current is reduced. However, when the whole semiconductor film is reduced in thickness in order to reduce the thickness of the channel forming region, the thickness of the source region and the drain region is also reduced, the sheet resistance between the source region and the drain region increases, and the contact resistance between the source region and the drain region and between the source electrode and the drain electrode increases. Therefore, it is preferable to reduce the thickness of the channel forming region while maintaining an adequate thickness of the source region and the drain region.

Patent Document 1 discloses an example of such a method as to reduce the thickness of only a channel forming region. According to the method disclosed in Patent Document 1, the thickness of a channel forming region is reduced by the following steps. First, a projection is formed over an insulating substrate at a position corresponding to a channel forming region formed later. Such a projection can be formed by removing part of the surface of the insulating substrate by etching. Then, a semiconductor layer made of silicon or the like is deposited over the insulating substrate including the projection so as to have a predetermined thickness and have a protruding portion at a position corresponding to the projection. Then, an insulating film with a flat surface is formed over the semiconductor layer. A photoresist film is formed over the insulating film at a position corresponding to the projection and ions are implanted into the semiconductor layer using the photoresist film as a mask, thereby forming a source region and a drain region in the semiconductor layer on both sides of the projection. After that, the photoresist film is removed. Then, the insulating film as well as the upper part of the protruding portion (i.e., channel forming region) of the semiconductor layer is removed by etching to flatten the surface of the semiconductor layer, thereby reducing the thickness of the channel forming region. The insulating film and the semiconductor layer are removed by plasma etching in an atmosphere containing a mixed gas of $SF_6$ and $CHF_3$. In the method as disclosed in Patent Document 1, in order to reduce the thickness of the protruding portion of the semiconductor layer corresponding to the projection over the upper surface of the insulating substrate, etching is performed until the whole surface of the semiconductor layer is exposed and flattened. Accordingly, the source region and the drain region as well as the protruding portion (channel forming region) are in danger of being etched. In addition, plasma etching may cause characteristic deterioration such as damage to the upper part of the semiconductor layer, transformation into an amorphous state, and increase in resistance due to these damages.

Patent Document 2 discloses another method for reducing the thickness of a channel forming region. According to Patent Document 2, a photosensitive resist provided over a semiconductor layer (operation layer) is exposed to light using a halftone mask so that the thickness of the photosensitive resist over a channel forming region of a TFT forming region is smaller than that of the photosensitive resist in a region outside the channel forming region. Then, the photosensitive resist is further processed to remove the photosensitive resist on the channel forming region, and wet etching or dry etching is applied using the remaining part of the photosensitive resist as a mask, thereby reducing the thickness of the channel forming region. However, such a selective exposure of a photosensitive resist using a halftone mask requires a complicated process, which may increase the production cost.

It is also known that in manufacturing of a thin film transistor, an amorphous silicon film is formed and then irradiated with laser light to be melted and crystallized, thereby forming a polycrystalline silicon film that serves as an active region (Patent Document 3).

[Patent Document 1] Japanese Published Patent Application No. H5-110099

[Patent Document 2] Japanese Published Patent Application No. 2004-281687

[Patent Document 3] Japanese Published Patent Application No. H11-111998

SUMMARY OF THE INVENTION

It is an object of the invention to provide a method for manufacturing a semiconductor device, by which a bottom gate thin film transistor (semiconductor device) that has an improved S value and a channel forming region with a smaller thickness than that of a source region and a drain region can be manufactured in a simple process.

It is another object of the invention to provide a method for manufacturing a semiconductor device, by which a bottom gate thin film transistor (semiconductor device) that has an improved S value and a channel forming region with a smaller thickness than that of a source region and a drain region can be manufactured in a simple process without damage to a semiconductor layer.

In order to achieve the aforementioned objects, the invention provides a method for manufacturing a semiconductor device, which includes the steps of: forming an island-like conductive film over a substrate having an insulating surface at a portion corresponding to at least a channel forming region and covering the island-like conductive film with an insulating film, thereby forming a projection portion; depositing an amorphous semiconductor film to cover the projection portion; irradiating the amorphous semiconductor film with laser light so that the amorphous semiconductor film is melted and crystallized and part of the melted semiconductor over the projection portion flows into regions adjacent to both sides of the projection portion, thereby forming a crystallized semiconductor film in which the film thickness over the projection portion is smaller than that of the regions adjacent to both sides of the projection portion; and adding an impurity element imparting one conductivity type to the crystallized semiconductor film in the regions adjacent to both sides of the projection portion, thereby forming a source region and a drain region.

The island-like conductive film functions as a gate electrode that is part of the semiconductor device (bottom gate structure), and the semiconductor film that overlaps the island-like conductive film and has a reduced thickness functions as a channel forming region. Another gate electrode may be provided over the channel forming region to form a dual gate structure. The side surfaces of the island-like conductive film may be either perpendicular or inclined to the main surface of the insulating substrate. In addition, the side surfaces of the island-like conductive film do not necessarily have a linear shape, and may have a curved shape. The laser light used to crystallize the amorphous semiconductor film is preferably generated by a CW laser or a quasi-CW laser.

According to the aforementioned method for manufacturing a semiconductor device of the invention, the amorphous semiconductor film is deposited to cover the projection portion formed over the insulating substrate, and is irradiated with laser light to be crystallized and melted so that part of the melted semiconductor over the projection portion flows into the regions adjacent to both sides of the projection portion Thus, crystallization of the semiconductor film and reduction in thickness of the semiconductor film (channel forming region) over the projection portion can be performed at a time. As a result, a semiconductor device that has an improved S value and the channel forming region with a thickness smaller than that of the source region and the drain region can be manufactured in a simple process while the semiconductor film is in no danger of being damaged by plasma etching or the like.

The method for manufacturing a semiconductor device may further include the step of forming other projection portions over the insulating substrate so that they are separated from the projection portion and sandwiches the projection portion, thereby forming a depression portion between the projection portion and each of the other projection portions. When the depression portions are thus provided on both sides of the projection portion, melted semiconductor film over the projection portions is accumulated in the depression portions in laser crystallization; therefore, it is possible to prevent the semiconductor film from completely flowing from the upper parts of the projection portions and the upper surfaces of the projection portions from being exposed.

The insulating substrate may have a light-transmitting property, and the step of adding an impurity element imparting one conductivity type to the crystallized semiconductor film may include the steps of: forming a resist over the crystallized semiconductor film; exposing the resist through the insulating substrate using the conductive film as a mask; removing an exposed portion of the resist; and adding the impurity element to the crystallized semiconductor film using the remaining part of the resist as a mask. Such a method using the backside exposure does not require another mask for patterning the resist, which results in simplification of the manufacturing process and reduction in cost.

The step of forming the projection portion may include the step of, after forming the island-like conductive film and before covering the island-like conductive film with the insulating film, forming sidewalls made of an insulating material so as to be in contact with side surfaces of the island-like conductive film. When such sidewalls are provided, dielectric breakdown of the gate insulating film adjacent to the side surfaces of the conductive film does not easily occur, and the ends of the conductive film are not easily exposed when covered with the insulating film.

The thickness of the amorphous semiconductor film is preferably about equal to or greater than the height of the projection portion. Accordingly, defective formation of the semiconductor film can be prevented.

According to the method for manufacturing a semiconductor device of the invention, the amorphous semiconductor film is deposited over the projection portion and the depression portions adjacent to the projection portion, which are formed over the insulating substrate. The amorphous semiconductor film is irradiated with laser light to be crystallized and melted so that the surface of the crystallized semiconductor film is flattened. Thus, crystallization of the semiconductor film and reduction in thickness of the channel forming region over the projection portion can be performed at a time. As a result, a semiconductor device that has an improved S value and the channel forming region with a thickness smaller than that of the source region and the drain region can be manufactured in a simple process while the semiconductor film is in no danger of being damaged by plasma etching or the like. When the S value decreases, the semiconductor device consumes less power and can operate at higher speed.

DETAILED DESCRIPTION OF THE INVENTION

Embodiment Mode

FIGS. 1A to 1J are cross-sectional views illustrating a method for manufacturing a semiconductor device (TFT) according to a preferred embodiment of the invention.

Figure 1A:
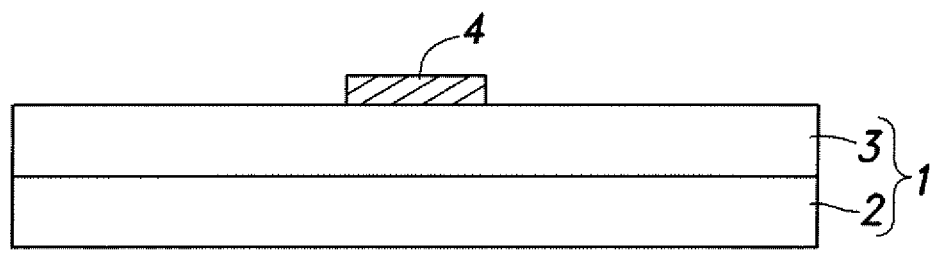
FIGS. 1A to 1J are cross-sectional views illustrating an embodiment of a method for manufacturing a semiconductor device according to the invention.

As illustrated in FIG. 1A, a conductive film is deposited over an insulating substrate 1 having an insulating surface, and patterned by etching or the like to form an island-like conductive film 4. In this example, the insulating substrate 1 includes a substrate 2 with a flat surface and a base film 3 formed over the substrate 2. The island-like conductive film 4 extends in a direction perpendicular to the paper of the drawing to be connected to a gate wiring.

The substrate 2 with a flat surface may be, for example, a glass substrate, a quartz substrate, a single crystal silicon substrate, a metal substrate, a heat-resistant plastic substrate, or the like. The insulating substrate 1 is only required to have an insulating surface so that a semiconductor film can be deposited thereover in a subsequent step, and the whole insulating substrate 1 is not necessarily formed of an insulating material.

The base film 3 may be formed of an insulating material having heat resistance and chemical resistance to the subsequent deposition process. For example, silicon nitride ($SiN_x$), silicon oxynitride ($SiO_xN_y$) silicon oxide ($SiO_x$), or the like can be used. Such materials are preferably deposited by, for example, CVD (chemical vapor deposition). The base film 3 may have a stacked-layer structure as well as a single layer structure. For example, when a semiconductor layer including a source region and a drain region is made of polycrystalline silicon, a trap level is readily generated at the interface between polycrystalline silicon and silicon nitride due to dangling bonds. There is also a problem of poor adhesion due to high internal stress of silicon nitride. Accordingly, it is preferable that a silicon nitride film he formed over the substrate, a silicon oxide film be formed thereover, and a polycrystalline silicon film be formed over the silicon oxide film. In general, the base film 3 preferably has a thickness of 30 to 300 nm. The base film 3 is not necessarily formed depending on the kind of the substrate 2 with a flat surface, such as in the case of a quartz substrate which is free from any impurity elements entering into a semiconductor layer.

The island-like conductive film 4 can be formed of, for example, an element selected from tantalum (Ta), tungsten (W), titanium (Ti), molybdenum (Mo), copper (Cu), chromium (Cr), or niobium (Nb), or an alloy or a compound that contains any of these elements as its main component. Alternatively, crystalline silicon having conductivity may also be used. The island-like conductive film 4 functions as a gate electrode of a TFT as described below. The island-like conductive film 4 desirably has a thickness of 50 nm or less, and a length of 10 µm or less in a channel length direction (length in a direction horizontal to the drawing).

In order to form the island-like conductive film 4, any of the aforementioned materials is deposited by sputtering for example. Then, a resist (not illustrated) is applied thereover, and exposed and developed to be patterned, thereby forming a resist mask. The film made of a material used for a gate electrode is etched by dry etching, wet etching, or the like using the resist mask. The resist mask is removed after the etching. The island-like conductive film 4 may be selectively formed using an ink jet device or the like instead of exposure and development of the resist mask.

The side surfaces of the island-like conductive film 4 are not necessarily perpendicular to the surface of the insulating substrate 1, and may be inclined. The island-like conductive film 4 formed in a tapered shape with inclined side surfaces has the advantage of improved coverage of an insulating film formed over the island-like conductive film 4. Furthermore, the side surfaces of the island-like conductive film 4 do not necessarily have a linear shape, and may have a curved shape. The island-like conductive film 4 can have various shapes as illustrated in FIGS. 2A to 2D for example.

Figure 1B:
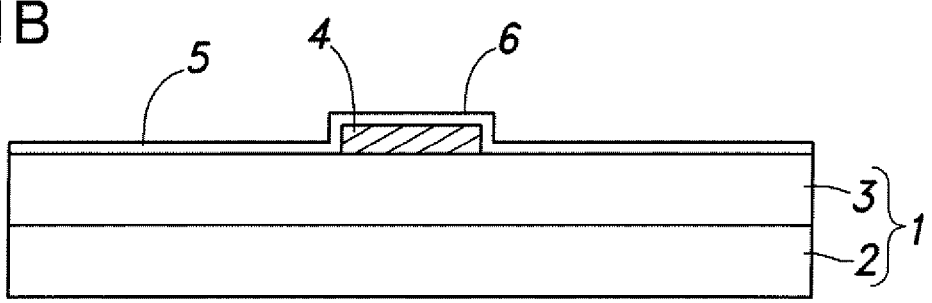

As illustrated in FIG. 1B, an insulating film (gate insulating film) 5 is formed to cover the island-like conductive film 4. As a result, a projection portion 6 having an insulating surface is formed at a position corresponding to the island-like conductive film 4. The insulating film 5 covering the island-like conductive film 4 can be formed of a material similar to those of the base film 3. The insulating film 5 may be formed by oxidizing the surface of the gate electrode (island-like conductive film) 4. The gate electrode 4 can be oxidized by oxygen plasma or oxygen atoms (radicals). The insulating film 5 preferably has a thickness of about 100 nm or less. Although the insulating film 5 may have a stacked-layer structure, it preferably has a single layer structure because charges may be trapped at the interface between the stacked layers. When the insulating film 5 is a silicon oxide film formed by CVD, the gate electrode 4 is preferably made of tantalum (Ta) to improve adhesion.

Figure 1C:
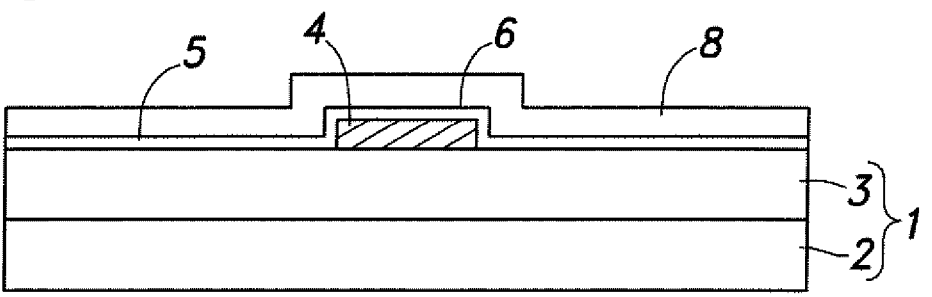

As illustrated in FIG. 1C, an amorphous silicon (a-Si) film 8 is deposited as an amorphous semiconductor film to cover the projection portion 6. The thickness of the amorphous silicon film 8 is desirably about equal to or greater than the height of the projection portion 6, and preferably 200 nm or less. The amorphous silicon film 8 can be formed by CVD or the like using a semiconductor gas such as silane ($SiH_4$). The amorphous silicon film 8 can be made of other semiconductor materials such as germanium, a silicon-germanium compound ($Si_xGe_{1-x}$), and a silicon-carbon compound as well as silicon.

Figure 1D:
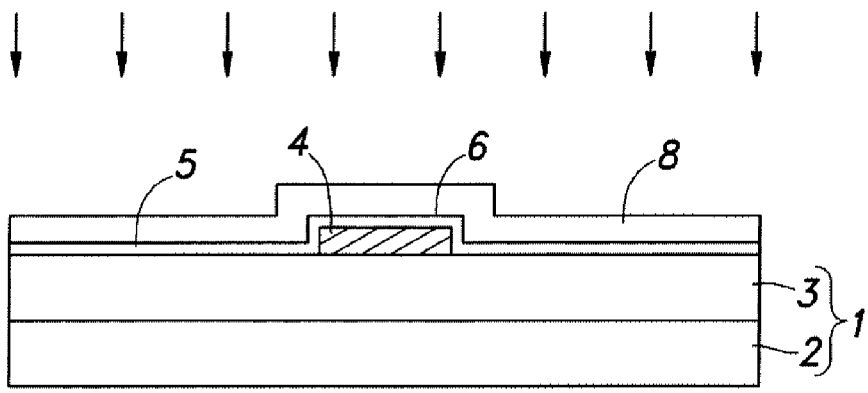
Figure 1E:
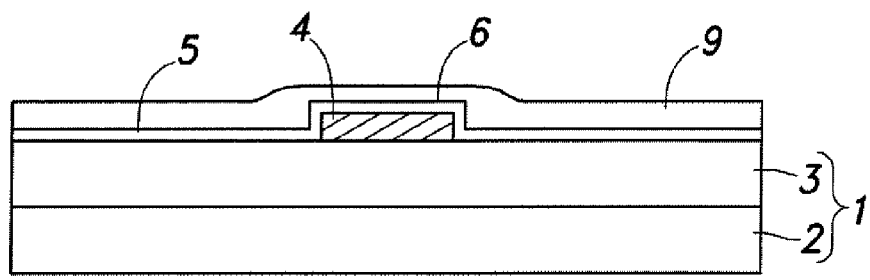

In the step of FIG. 1D, the amorphous silicon film 8 is irradiated with laser light to be completely melted. The laser light is shaped into, for example, a linear beam (that is, beam with a high aspect ratio). The laser light may be scanned so that the whole amorphous silicon film 8 is irradiated with the laser light. Accordingly, the amorphous silicon film 8 is crystallized to be a polycrystalline silicon (poly-Si) film 9. At this time, melted silicon over the projection portion 6 flows into regions adjacent to both sides of the projection portion 6, which results in reduction in thickness of the polycrystalline silicon film 9 over the projection portion 6 (FIG. 1E). For example, the polycrystalline silicon film 9 over the projection portion 6 has a thickness of about 50 nm or less, and the polycrystalline silicon film 9 adjacent to both sides of the projection portion 6 has a thickness of about 50 to 200 nm. Note that the completely melted amorphous silicon film 8 means that the amorphous silicon film 8 is melted from the surface to the bottom and the whole melted portion is in a liquid state. However, the invention is not limited to this, and silicon at least over the projection portion 6 may be melted to flow into regions adjacent to the projection portion 6.

The aforementioned crystallized semiconductor film may be obtained by a laser crystallizing method using any of a gas laser, a liquid laser, and a solid laser, above all, either a gas laser or a solid laser is preferably used, and more preferably a solid laser is used. A plurality of lasers may also be combined.

The gas laser includes, for example, an Ar laser, a Kr laser, a helium-neon laser, a carbon dioxide gas laser, and an excimer laser. The excimer laser includes a rare gas excimer laser and a rare gas halide excimer laser. The rare gas excimer laser oscillates by three kinds of excited molecules: argon, krypton, and xenon. The argon ion laser includes a rare gas ion laser and a metal vapor ion laser. The solid laser includes, for example, a glass laser; a ruby laser; an alexandrite laser; a Ti:sapphire laser; and a laser using a medium in which a base material is added with one or more of Nd, Yb, Cr, Ti, Ho, Er, Tm, and Ta as a dopant (active species). The base material includes single crystalline YAG, $YVO_4$, forsterite ($Mg_2SiO_4$), $YAlO_3$, or $GdVO_4$, and polycrystalline (ceramic) YAG, $Y_2O_3$, $YVO_4$, $YAlO_3$, or $GdVO_4$. The liquid laser includes an inorganic liquid laser, an organic chelate laser, and a dye laser. The inorganic liquid laser and the organic chelate laser use, as a laser medium, a rare-earth ion such as neodymium that is utilized for a solid laser. A crystal with a large grain diameter can be obtained by irradiation with the fundamental wave of such a laser or the second harmonic to the fourth harmonic of such a laser.

An Ar ion laser, a Ti:sapphire laser, and a laser using a medium in which single crystalline YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$ is added with one or more of Nd, Yb, Cr, Ti, Ho, Er, Tm, and Ta as a dopant can oscillate in a continuous wave manner (continuous wave (CW) laser), as well as in a pulsed manner with a repetition rate of 10 MHz or more if Q switch operation, mode locking, or the like is performed. Among the pulsed lasers, a pulsed laser with a repetition rate of 10 MHz or more is referred to as a quasi-CW laser. A portion irradiated with such a laser can be kept completely melted just as a portion irradiated with the CW laser.

It is desirable that the wavelength of the continuous wave laser light be 200 to 700 nm in consideration of the absorption coefficient of the amorphous semiconductor film. Light of such a wavelength range can be obtained by extracting the second harmonic and the third harmonic of a fundamental wave using a wavelength conversion element. For the wavelength conversion element, ADP (ammonium dihydrogen phosphate), $Ba_2NaNb_5O_{15}$ (barium sodium niobate), CdSe (cadmium selenide), KDP (potassium dihydrogen phosphate), $LiNbO_3$ (lithium niobate), Se, Te, LBO, BBO, $KB_5$, or the like can be applied. In particular, LBO is desirably used. When the semiconductor film contains silicon as its main component, the wavelength of the laser light may be 800 nm or less so as to be absorbed by silicon, and preferably about 350 to 550 nm. The laser light is preferably emitted with oscillation of $TEM_{00}$ (single lateral mode), leading to greater uniformity in energy of a linear beam spot that is obtained on an irradiated surface. Note that laser crystallization may be performed not only by scanning the amorphous semiconductor film with a linear beam, but also by an exposure method in which an object to be irradiated does not move at the time of irradiation with an electromagnetic wave of a laser or the like. For example, one-shot exposure or step exposure may be used. A linear laser beam is used with advantage to obtain sufficient energy density to completely melt a region of the amorphous semiconductor film irradiated with the laser beam. However, the invention is not limited to this shape, and a laser beam having a rectangular shape or an elliptical shape may also be used as long as the amorphous semiconductor film can be melted.

After the laser crystallization, heat treatment at 500 to 600° C. may be performed to remove a distortion accumulated in the crystalline semiconductor film. This distortion is generated by shrinkage in the volume of the semiconductor caused by crystallization, thermal stress with the base, lattice mismatch, or the like. The heat treatment may be performed using typical heat treatment apparatus, and treatment for 1 to 10 minutes may be performed by, for example, rapid thermal annealing (RTA) using heated gas. The RTA makes it possible to perform heat treatment at a higher temperature, for example, 500 to 700° C. Note that this step is not necessarily performed in the invention, and may be employed as appropriate.

The polycrystalline silicon film 9 over the projection portion 6, which is obtained by laser crystallization, does not always have a completely flat surface. In that case, the surface of the polycrystalline silicon film 9 may be flattened by chemical mechanical polishing (CMP) after the laser crystallization. When the polycrystalline silicon film 9 has a flat surface, a gate insulating film formed in a subsequent step can be reduced in thickness; thus a semiconductor device with a smaller thickness can be manufactured. Furthermore, the withstand voltage of the gate insulating film can be improved.

Figure 1F:
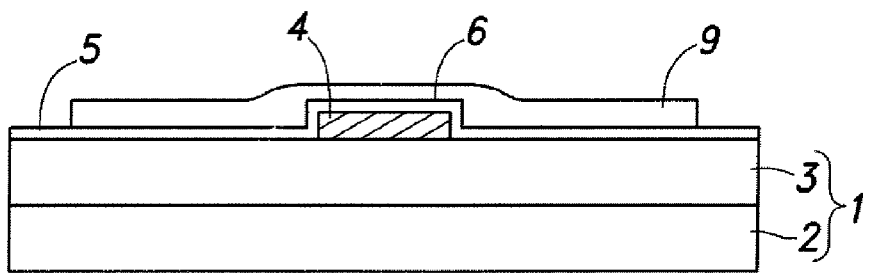

Then, as illustrated in FIG. 1F, the polycrystalline silicon film 9 is dry-etched using an appropriate mask (not illustrated) to have an island shape. Dry etching can be performed using an etching gas including a fluorine-based gas such as $CF_4$, $NF_3$, $SF_6$, $CHF_3$, and $CF_4$, a mixed gas in which such a fluorine-based gas is suitably added with $O_2$ gas, $H_2$ gas, or an inert gas such as He and Ar, or the like. It is preferable to use a mixed gas containing $CF_4$ and $O_2$, a mixed gas containing $SF_6$ and $O_2$, a mixed gas containing $CHF_3$ and He, or a mixed gas containing $CF_4$ and $H_2$. Moreover, wet etching as well as dry etching may be performed. In that case, the polycrystalline silicon film 9 is wet-etched using an organic alkaline aqueous solution typified by TMAH (tetramethylammonium hydroxide), thereby having an island shape. The use of a TMAH solution or the like makes it possible to selectively etch only the polycrystalline silicon film 9; therefore, etching can be performed without damaging the base insulating layer.

Figure 1G:
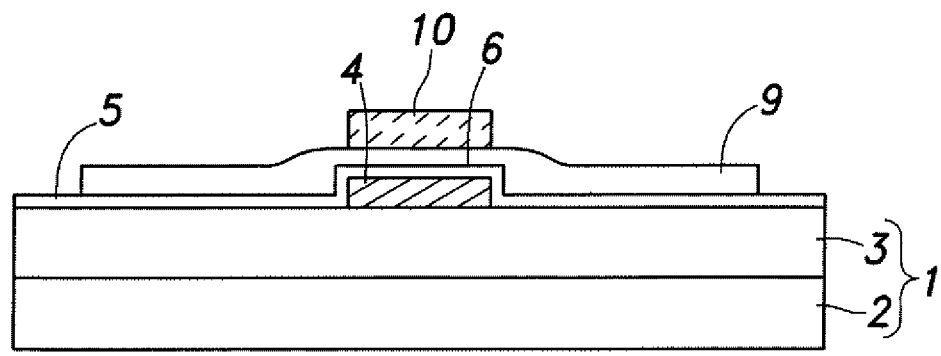

In the step of FIG. 1G a resist 10 is deposited and exposed using an appropriate mask (not illustrated) to be patterned. Then, an exposed portion of the resist 10 is removed so as to leave only a portion of the resist 10 over the polycrystalline silicon film 9, which overlaps the island-like conductive film 4.

Figure 1H:
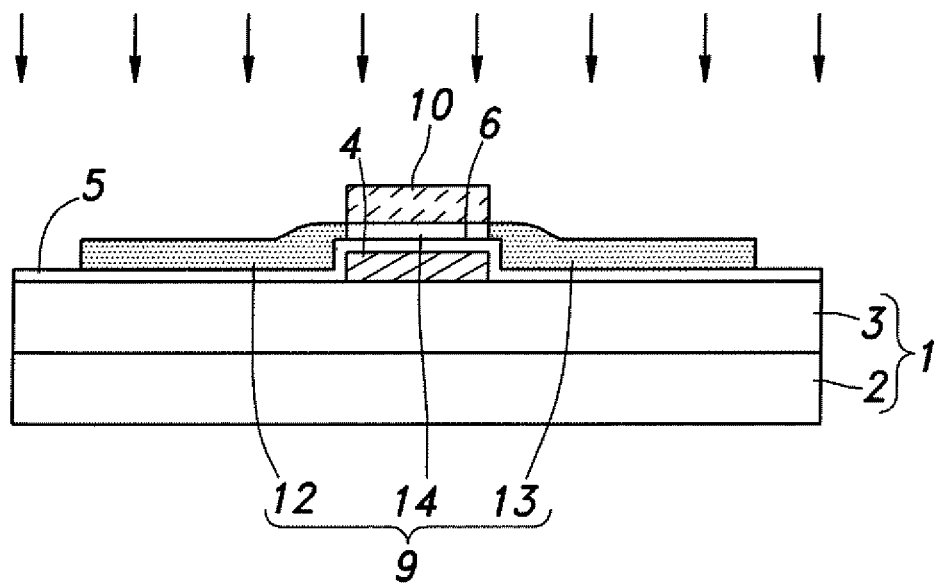
Figure 3:
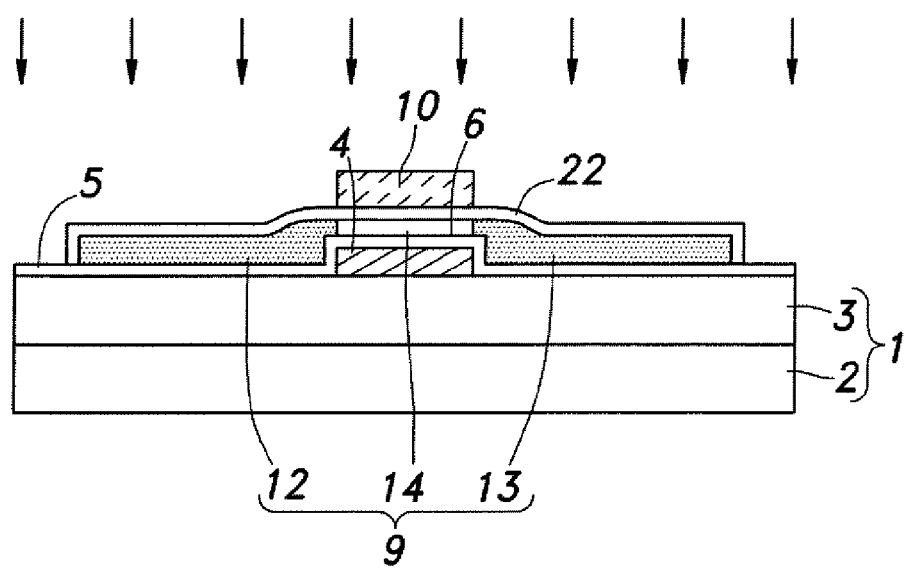
FIG. 3 is a cross-sectional view illustrating a modified embodiment of the step illustrated in FIG. 1H.

As illustrated in FIG. 1H, the polycrystalline silicon film 9 is added with a high concentration of impurity element (such as phosphorus (P) and boron (B)) using the remaining part of the resist 10 as a mask by plasma doping or ion implantation, thereby forming a source region 12 and a drain region 13. A portion of the polycrystalline silicon film 9 between the source region 12 and the drain region 13, which is not added with any impurity element (i.e., a portion over the island-like conductive film 4), serves as a channel forming region 14. In other words, the island-like conductive film 4 under the channel forming region 14 functions as a gate electrode (bottom gate structure). The impurity element added to the polycrystalline silicon film 9 is appropriately selected depending on the desired conductivity. As the impurity element imparting N-type conductivity, an element that belongs to Group 15, for example, phosphorus (P) or arsenic (As) may be used. Boron (B) is typically used as the impurity element imparting P-type conductivity. The portion of the polycrystalline silicon film 9, which is not covered with the resist 10, may be covered with an ultrathin oxide film such as a natural oxide film if a sufficient concentration of impurity element can be doped into the portion. Alternatively, as illustrated in FIG. 3, a barrier layer 22 made of an inorganic insulating material may be formed over the polycrystalline silicon film 9 before the resist is applied, and the impurity element may be added to the polycrystalline silicon film 9 through the barrier layer 22. The barrier layer 22 can be formed of, for example, silicon oxide, and it preferably has a thickness of about 100 nm or less so that doping can be carried out through the layer. The barrier layer 22 covering the surface of the polycrystalline silicon film 9 prevents the channel forming region 14 from being contaminated with the remaining impurity element that is doped into the source region 12 and the drain region 13.

Figure 1I:
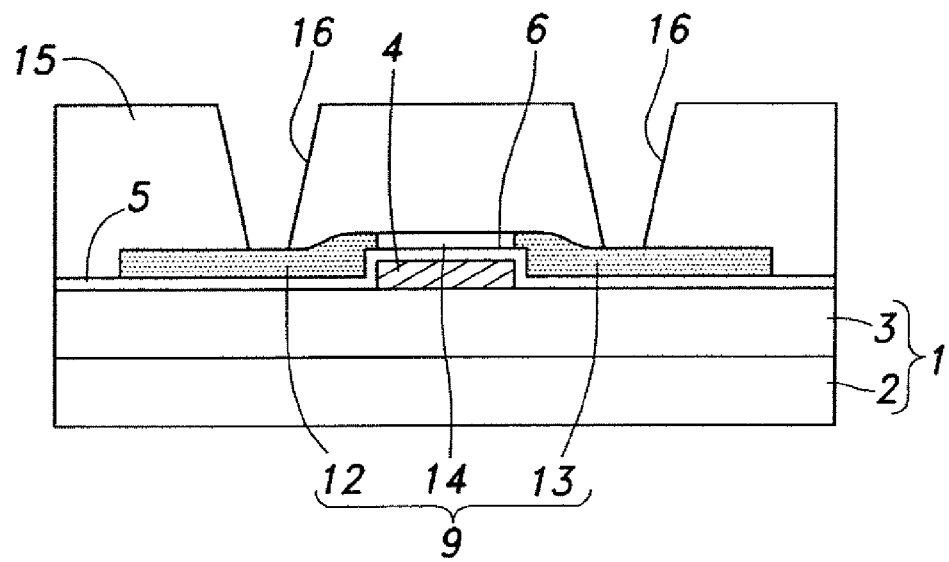

In the step of FIG. 1I, the resist 10 is removed and an interlayer insulating film 15 is formed. Then, openings (contact holes) 16 are formed by, for example, etching so as to reach the polycrystalline silicon film 9 (source region 12 and drain region 13) over the substrate 1. The interlayer insulating film 15 can be formed of, for example, a material similar to those of the base film 3 or the gate insulating film 5. Alternatively, the interlayer insulating film 15 may be formed of an organic material (such as polyimide and polyamide) by droplet discharging (ink-jet method) or spin coating. The use of spin coating is advantageous in that the surface of the interlayer insulating film 15 can be easily flattened. After an inorganic material is deposited as the interlayer insulating film 15 by CVD, the surface of the interlayer insulating film 15 may be flattened by CMP (chemical mechanical polishing). The openings 16 can be directly formed by droplet discharging, which results in omission of the additional step of forming the openings 16. The interlayer insulating film 15 typically has a thickness of about 750 nm to 3 µm.

Figure 1J:
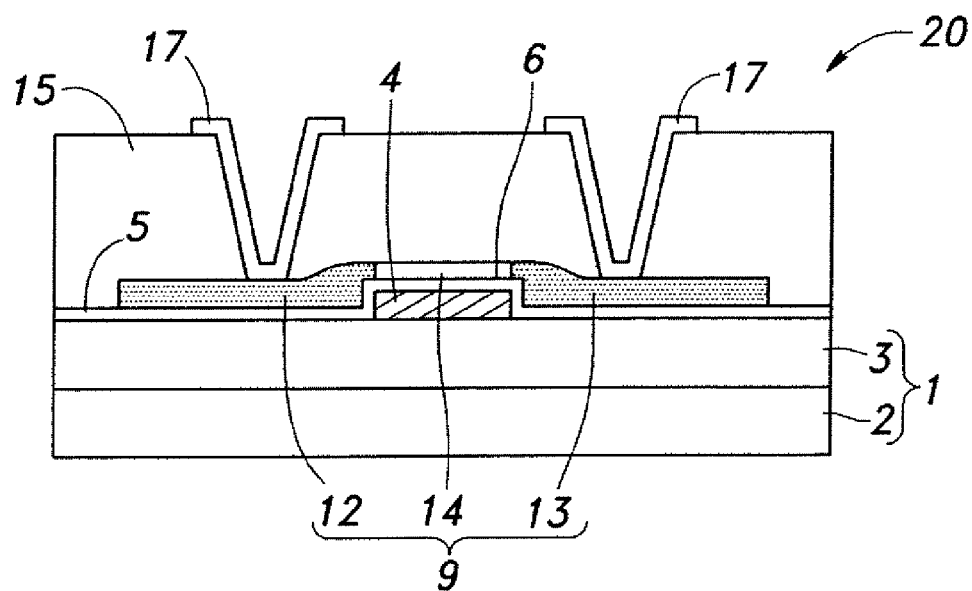
Figure 2A:
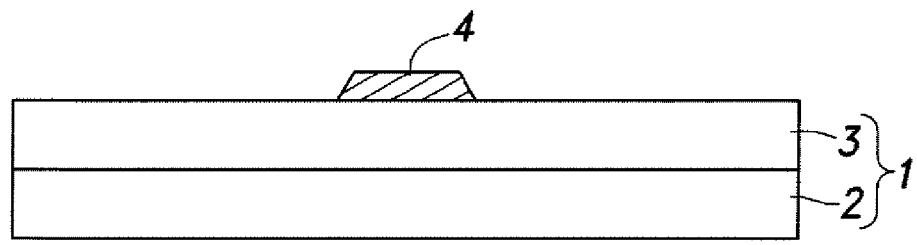
FIGS. 2A to 2D are cross-sectional views each illustrating an example of the shape of an island-like conductive film.
Figure 2B:
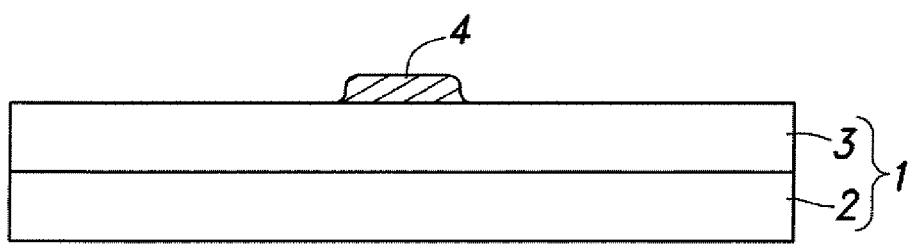
Figure 2C:
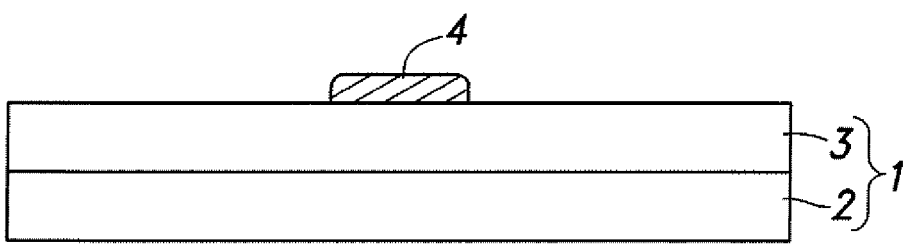
Figure 2D:
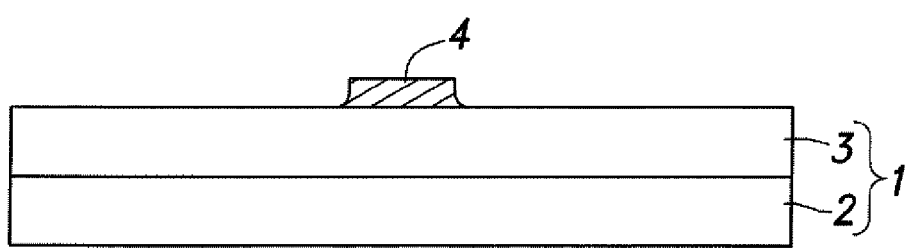

Then, conductive layers 17 serving as wirings connected to the source region 12 and the drain region 13 are formed as illustrated in FIG. 1J, thereby obtaining a TFT 20. The conductive layers 17 may be formed of any material having conductivity. For example, any of the aforementioned materials of the conductive film (gate electrode) 4 may be deposited by sputtering and appropriately patterned so as to form the conductive layers 17.

As set forth above, according to the method for manufacturing a semiconductor device (TFT) of the preferred embodiment of the invention, the projection portion 6 is formed by covering the island-like conductive film 4 formed over the insulating substrate 1 with the insulating film 5. Then, the amorphous semiconductor film 8 is formed over the projection portion 6 as well as over the regions sandwiching the projection portion 6, and is irradiated with laser light to be melted. Thus, the amorphous semiconductor film 8 over the projection portion 6 is crystallized and melted semiconductor flows into the regions adjacent to the projection portion 6. As a result, the crystallized semiconductor film 9 formed over the projection portion 6 has a thickness smaller than that of the crystallized semiconductor film 9 adjacent to both sides of the projection portion 6. The semiconductor film 9 that is formed over the projection portion 6 and has a reduced thickness functions as the channel forming region 14, while the semiconductor film 9 that is adjacent to both sides of the projection portion 6 and has a larger thickness is added with the impurity element to function as the source region 12 and the drain region 13. In other words, according to the method for manufacturing a semiconductor device of the invention, when the amorphous semiconductor film 8 is irradiated with laser light to be melted, crystallization of the semiconductor film 8 and reduction in thickness of the channel forming region 14 can be performed at a time. Thus, the thickness of the channel forming region 14 can be made smaller than that of the source region 12 and the drain region 13 in a simple process, leading to a semiconductor device with an improved S value. When the S value decreases, the semiconductor device can operate at a lower threshold voltage; thus, the power consumption of the semiconductor device can be suppressed by reducing the power supply voltage while maintaining the operating speed. In addition, the method for manufacturing a semiconductor device of the invention does not require plasma etching or the like to reduce the thickness of the channel forming region 14; therefore, the semiconductor film 9 is in no danger of being damaged by plasma etching or the like.

Figure 4A:
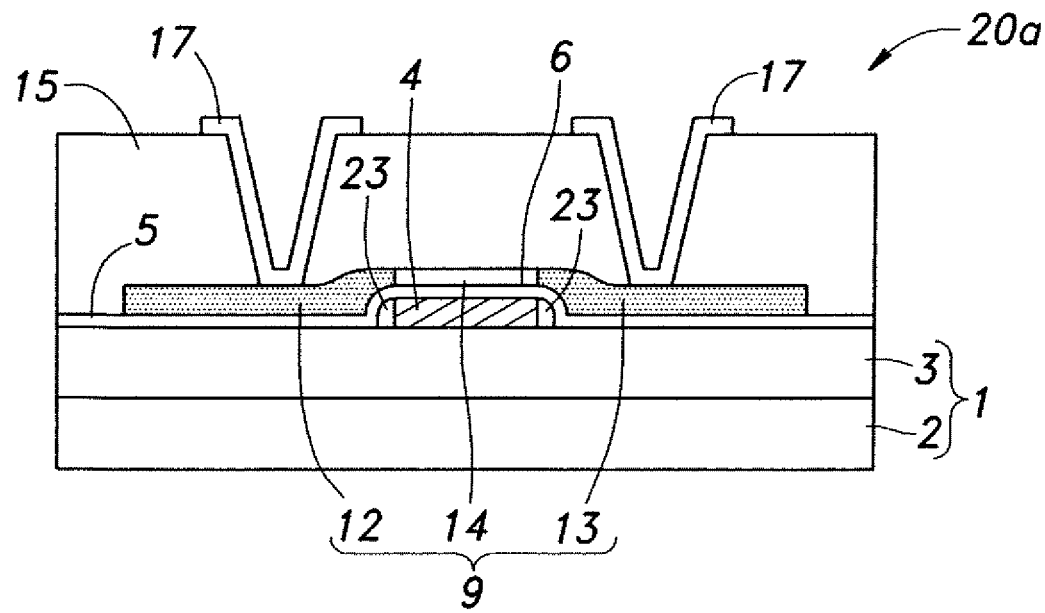
FIG. 4A is a cross-sectional view illustrating another embodiment of a semiconductor device according to the invention.

FIG. 4A is a cross-sectional view illustrating a modified embodiment of the TFT 20 illustrated in FIG. 1J. A TFT 20a of FIG. 4A is different from the TFT 20 of FIG. 1J in that sidewalls 23 made of an insulating material are provided in contact with the side surfaces of the conductive film (gate electrode) 4. When such sidewalls 23 are provided, dielectric breakdown of the gate insulating film adjacent to the side surfaces of the conductive film 4 does not easily occur, and the ends of the conductive film 4 are not easily exposed when covered with the insulating film 5. Moreover, the polycrystalline silicon film 9 over the sidewalls 23 has a thickness smaller than that of the other regions of the polycrystalline silicon film 9, and thus has a higher resistance even with the same impurity concentration. Accordingly, the polycrystalline silicon film 9 over the sidewalls 23 can function substantially as an LDD region with a lower impurity concentration.

Figure 4B:
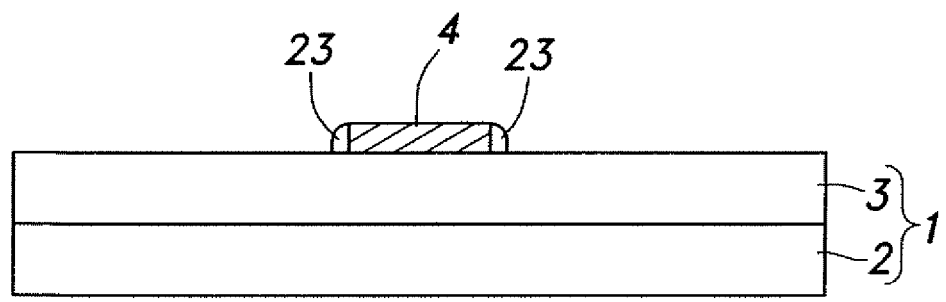
FIG. 4B is a cross-sectional view illustrating a step of manufacturing the semiconductor device illustrated in FIG. 4A.

The sidewalls 23 can be formed by, as illustrated in FIG. 4B, forming the island-like conductive film 4 over the insulating substrate 1, forming an insulating film thereover, and removing an unnecessary portion by isotropically etching.

FIGS. 5A to 5K are cross-sectional views illustrating a method for manufacturing a semiconductor device (TFT) according to another embodiment of the invention. In this embodiment, elements similar to those illustrated in FIGS. 1A to 1H are indicated by the same numerals, and description thereon is omitted.

Figure 5A:
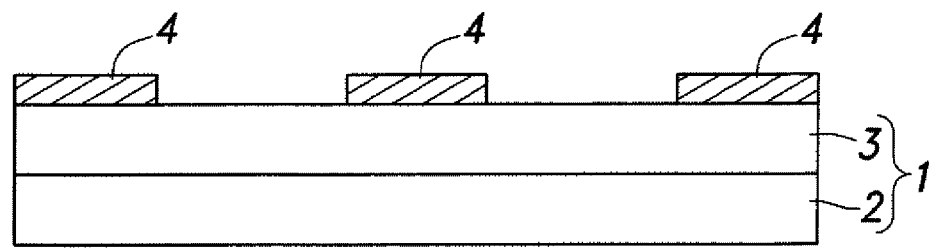
FIGS. 5A to 5K are cross-sectional views illustrating another embodiment of a method for manufacturing a semiconductor device according to the invention.

As illustrated in FIG. 5A, a conductive film is deposited over the insulating substrate 1 having an insulating surface, and is patterned by etching or the like to form a plurality of island-like conductive films 4 separated from each other. The insulating substrate 1 includes the substrate 2 with a flat surface and the base film 3 formed over the substrate 2. The conductive films 4 extend in a direction perpendicular to the paper of the drawing to be connected to a gate wiring.

Figure 5B:
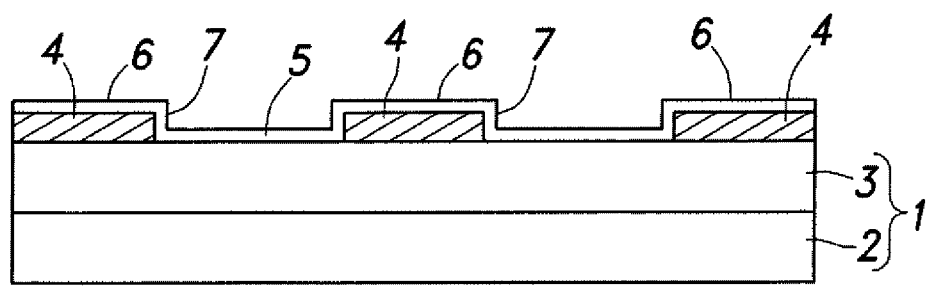

As illustrated in FIG. 5B, the insulating film (gate insulating film) 5 is formed to cover the island-like conductive films 4. As a result, the projection portions 6 each having an insulating surface are formed at positions corresponding to the island-like conductive films 4. Depression portions 7 are formed between any two adjacent projection portions 6.

Figure 5C:
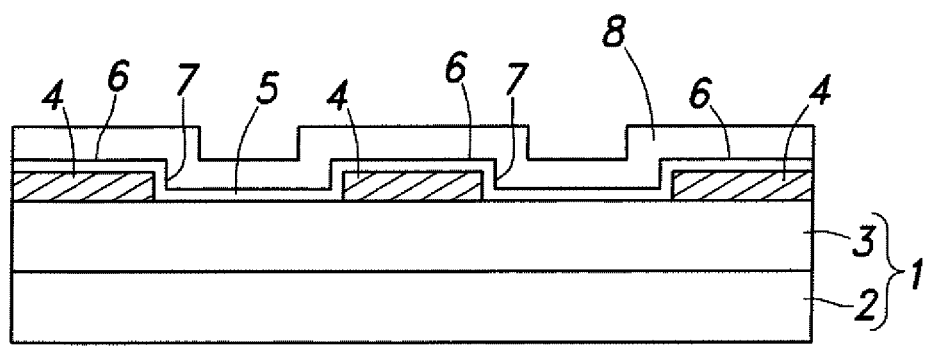

As illustrated in FIG. 5C, the amorphous silicon (a-Si) film 8 is deposited as an amorphous semiconductor film over the projection portions 6 and the depression portions 7. The thickness of the amorphous silicon film 8 is desirably about equal to or greater than the height of the projection portions 6 (i.e., the depth of the depression portions 7).

Figure 5D:
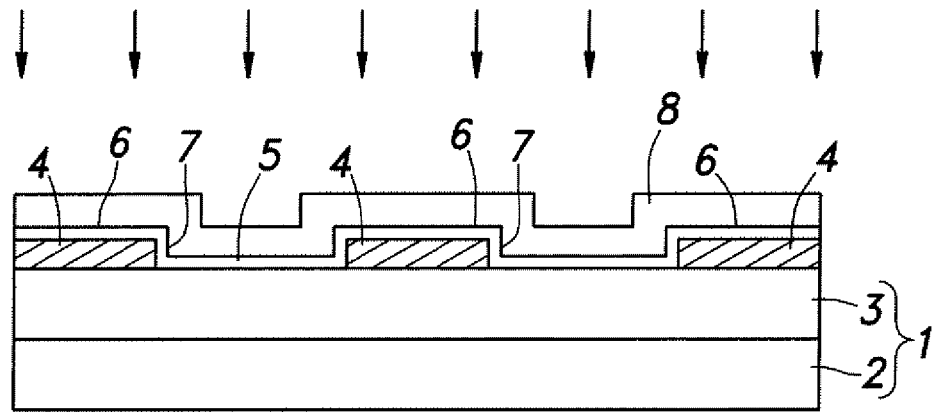
Figure 5E:
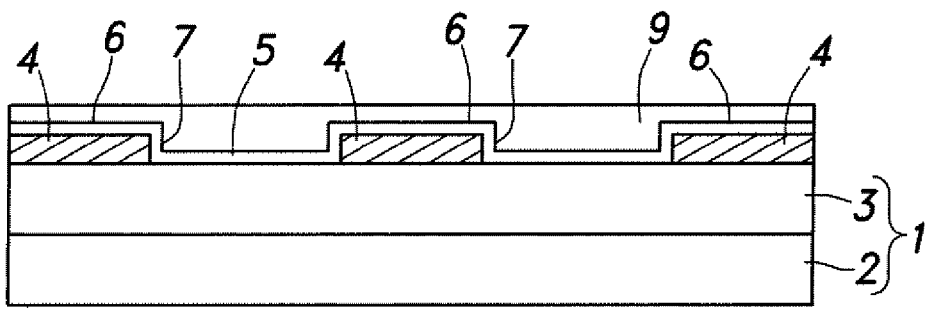

In the step of FIG. 5D, the amorphous silicon film 8 is irradiated with laser light to be melted. Accordingly, the amorphous silicon film 8 is crystallized to be the polycrystalline silicon (poly-Si) film 9. At this time, melted silicon flows into the depression portions 7 so that the surface of the polycrystalline silicon film 9 is flattened (FIG. 5E). This is because upon melting of silicon, the interface between melted silicon and the gas phase reaches the equilibrium state whether over the projection portions 6 or over the depression portions 7, thereby forming the interface with a flat surface. As a result, the polycrystalline silicon film 9 over the projection portions 6 has a thickness smaller than that of the polycrystalline silicon film 9 over the depression portions 7. In addition, when the depression portions 7 are provided on both sides of each of the projection portions 6, melted silicon over the projection portions 6 is accumulated in the depression portions 7; therefore, the surfaces of the projection portions 6 can be prevented from being exposed due to silicon flowing from the upper parts of the projection portions 6.

Figure 5F:
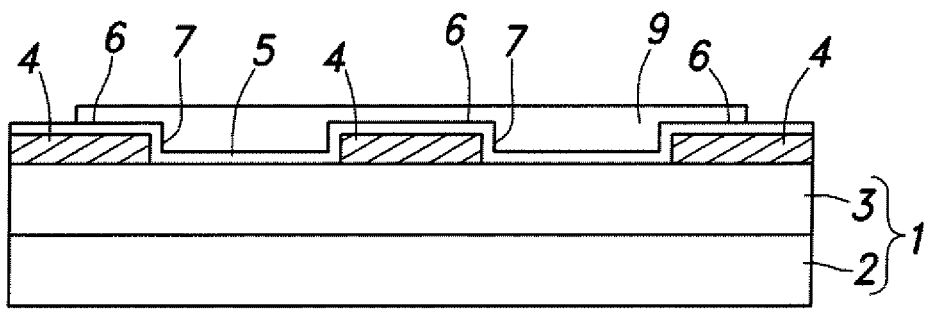

As illustrated in FIG. 5F, the polycrystalline silicon film 9 is dry-etched using an appropriate mask (not illustrated) to have an island shape.

Figure 5G:
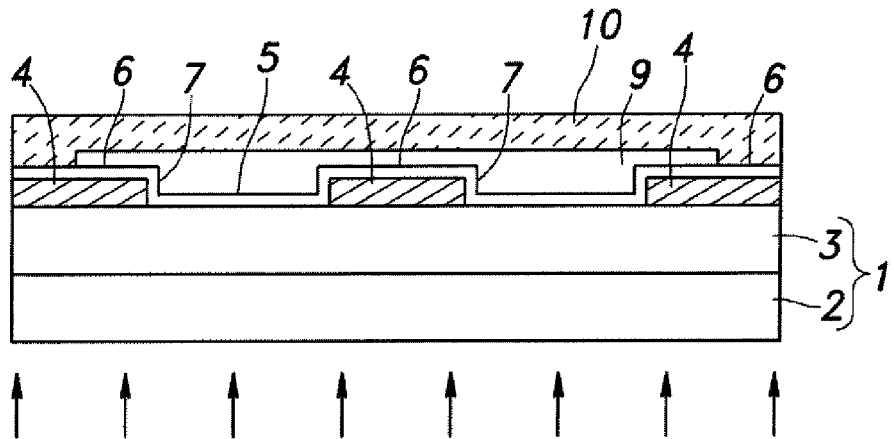

In the step of FIG. 5G, the resist 10 is applied and then patterned by backside exposure in which light is emitted from the bottom surface using the island-like conductive films 4 as masks. When both a P-type TFT and an N-type TFT are formed over the same substrate, the backside exposure may be performed using a mask having an appropriate opening so as to expose a source region and a drain region (i.e., regions to be added with an impurity element) of one of the P-type TFT and the N-type TFT. In the case of performing such a backside exposure, a light-transmitting substrate is naturally used as the insulating substrate 1.

Figure 5H:
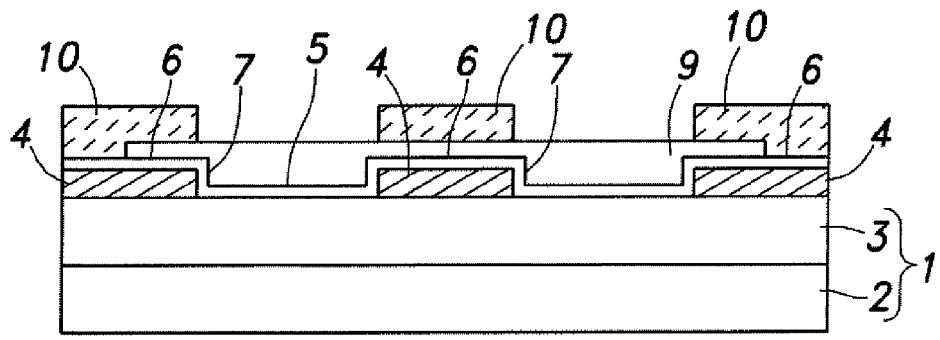

As illustrated in FIG. 5H, an exposed portion of the resist 10 is removed so that the resist 10 remains only in portions over the polycrystalline silicon film 9, which overlap the island-like conductive films 4. Such a backside exposure makes it possible to pattern the resist 10 with accuracy.

Figure 5I:
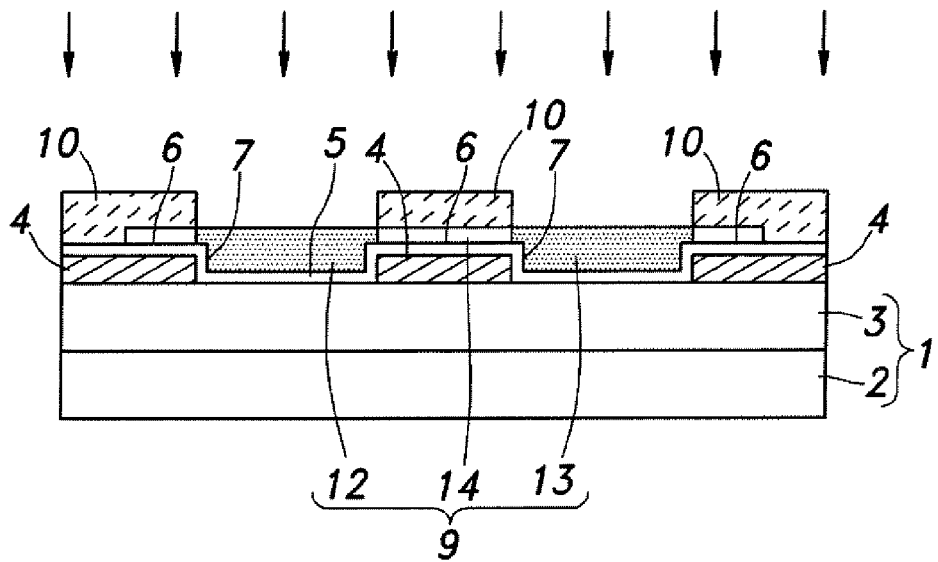

As illustrated in FIG. 5I, the polycrystalline silicon film 9 is added with a high concentration of impurity element (such as phosphorus (P) and boron (B)) using the remaining part of the resist 10 as a mask, for example, by plasma doping or ion implantation, thereby forming the source region 12 and the drain region 13. A portion of the polycrystalline silicon film 9 between the source region 12 and the drain region 13, which is not added with any impurity element (i.e., a portion over the island-like conductive film 4), serves as the channel forming region 14. In other words, the island-like conductive film 4 under the channel forming region 14 functions as a gate electrode (bottom gate structure).

Figure 5J:
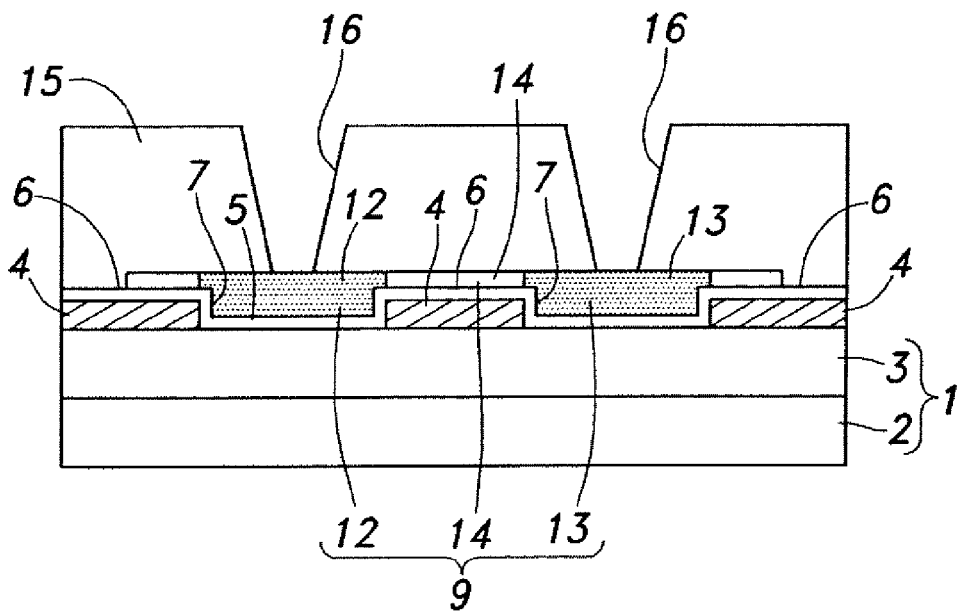

In the step of FIG. 5J, the resist 10 is removed and the interlayer insulating film 15 is formed. Then, the openings (contact holes) 16 are formed by, for example, etching so as to reach the polycrystalline silicon film 9 (source region 12 and drain region 13) over the depression portions 7 over the substrate 1.

Figure 5K:
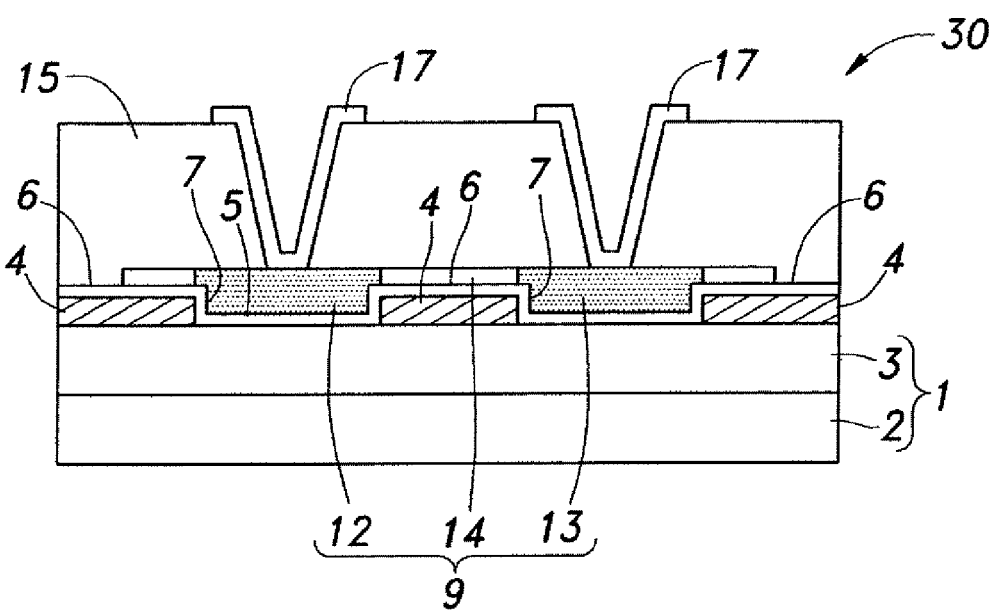

Then, the conductive layers 17 serving as wirings connected to the source region 12 and the drain region 13 are formed as illustrated in FIG. 5K, thereby obtaining a TFT 30.

As set forth above, according to the method for manufacturing a semiconductor device (TFT) illustrated in FIGS. 5A to 5K, the projection portions 6 are formed by covering the island-like conductive films 4 formed over the insulating substrate 1 with the insulating film 5. Then, the amorphous semiconductor film 8 is formed over the projection portions 6 as well as over the depression portions 7 sandwiching each of the projection portions 6, and is irradiated with laser light to be melted. Thus, the amorphous semiconductor film 8 is crystallized and melted semiconductor flows into the depression portions 7 so that the surface of the crystallized semiconductor is flattened. As a result, the crystallized semiconductor film 9 over the projection portions 6 has a thickness smaller than that of the crystallized semiconductor film 9 inside the depression portions 7. The semiconductor film 9 that is formed over the projection portions 6 and has a reduced thickness functions as the channel forming region 14, while the semiconductor film 9 that is formed inside the depression portions 7 and has a larger thickness is added with the impurity element to function as the source region 12 and the drain region 13. In other words, according to the method for manufacturing a semiconductor device of the invention, when the amorphous semiconductor film 8 is irradiated with laser light to be melted, crystallization of the semiconductor film 8 and reduction in thickness of the channel forming region 14 can be performed at a time. Thus, the thickness of the channel forming region 14 can be made smaller than that of the source region 12 and the drain region 13 in a simple process, leading to a semiconductor device with a smaller S value. When the S value decreases, the semiconductor device can operate at a lower threshold voltage; thus, the power consumption of the semiconductor device can be suppressed by reducing the power supply voltage while maintaining the operating speed. In addition, the method for manufacturing a semiconductor device of the invention does not require plasma etching or the like to reduce the thickness of the channel forming region 14; therefore, the semiconductor film 9 is in no danger of being damaged by plasma etching or the like.

Figure 6:
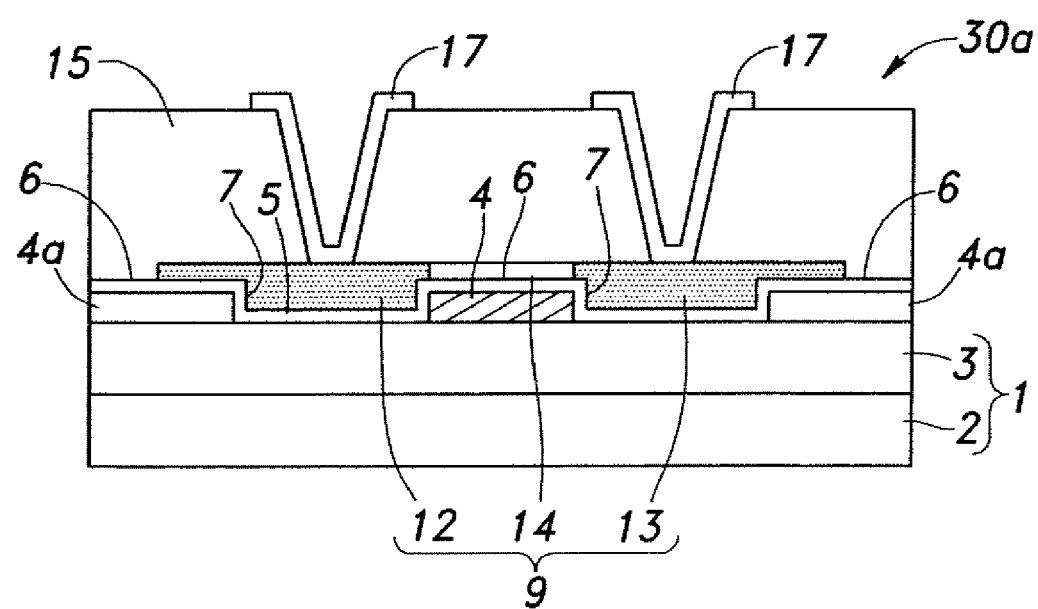
FIG. 6 is a cross-sectional view illustrating another embodiment of a semiconductor device according to the invention.

Although each of the projection portions 6 includes the island-like conductive film 4 in the TFT 30 of FIG. 5K, not all the projection portions 6 are required to include the island-like conductive film 4 and the island-like conductive film 4 may be provided only in a position corresponding to the channel forming region 14 (for example, the projection portion 6 at the center of FIG. 5K). FIG. 6 illustrates a TFT 30a in which the island-like conductive film 4 is selectively provided. In FIG. 6, the projection portions 6 in positions where channel forming region 14 is not formed include an island-like insulating film 4a made of an insulating material such as silicon nitride, silicon oxynitride, and silicon oxide. Such an island-like insulating film 4a can be obtained by, for example, forming the island-like conductive films 4 over the insulating substrate 1 as in the step of FIG. 5A, forming an insulating film thereover so as to have a desired thickness, and appropriately patterning the insulating film. Alternatively, the island-like conductive films 4 may be obtained by forming the island-like insulating films 4a over the insulating substrate 1, forming a conductive film thereover, and appropriately patterning the conductive film. The island-like insulating film is required to be made of a material having predetermined heat resistance to withstand a subsequent step, and is preferably made of an inorganic insulating material for example.

The TFT 30a also includes the depression portions 7 that are formed between any two adjacent projection portions 6. In a manner similar to the aforementioned one, the polycrystalline silicon film 9 that includes the channel forming region 14 having a thickness smaller than that of the source region 12 and the drain region 13 can be formed in a simple process using laser crystallization. Although both the island-like conductive film 4 and the island-like insulating films 4a are covered with the gate TO insulating film 5 in FIG. 6, only the island-like conductive film 4 may be covered with the gate insulating film 5. However, also in that case, the projection portions 6 preferably have about the same height.

Figure 7:
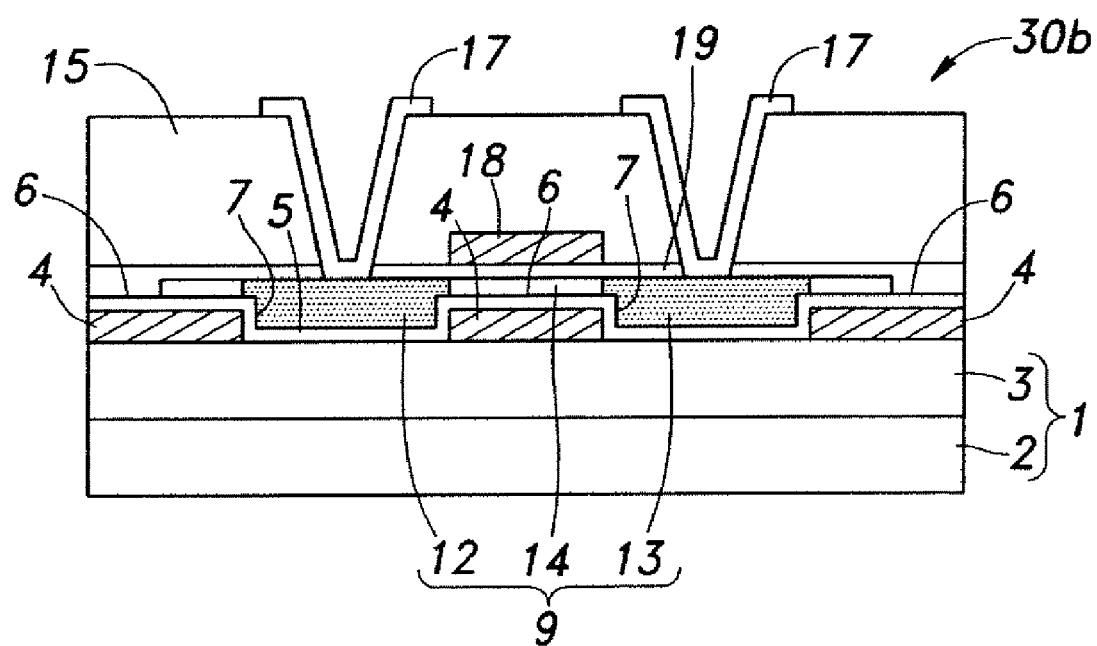
FIG. 7 is a cross-sectional view illustrating another embodiment of a semiconductor device according to the invention.

FIG. 7 is a cross-sectional view illustrating a still further modified embodiment of the TFT 30 of FIG. 5K. A TFT 30b of FIG. 7 is different from the TFT 30 of FIG. 5K in that another gate electrode 18 is provided over the channel forming region 14 with a gate insulating film 19 interposed therebetween. In other words, the TFT 30b of FIG. 7 has a dual gate structure. The S value can be further improved (i.e., reduced) by adopting such a dual gate structure. Moreover, variation in threshold voltage of the TFT 30b as well as the off-current can be reduced. When the S value decreases, the TFT 30b can operate at a lower threshold voltage; thus, the power consumption of the TFT 30b can be suppressed by reducing the power supply voltage while maintaining the operating speed.

The method for manufacturing a semiconductor device (TFT) of the invention can be applied to manufacture, for example, a pixel transistor or a switching TFT in a peripheral driver circuit of a liquid crystal display device. The invention can also be applied to manufacture switching TFTs in other typical semiconductor integrated circuits. The invention can be applied to electronic devices such as a desktop, floor-stand or wall-hung display, a camera such as a video camera and a digital camera, a goggle-type display, a navigation system, an audio reproducing device (e.g., a car audio set or an audio component stereo), a computer, a game machine, a portable information terminal (e.g., a mobile computer, a cellular phone, a portable game machine, or an e-book reader), and an image reproducing device provided with a recording medium (specifically, a device that reproduces video or still images recorded in a recording medium such as a digital versatile disc (DVD) and has a display for displaying the reproduced images). Specific examples of these electronic devices are illustrated in FIGS. 8A to 8H.

Figure 8A:
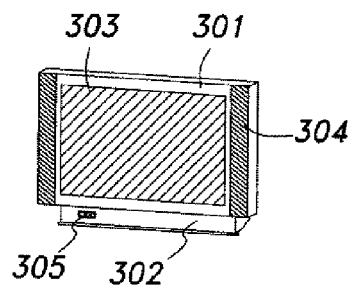
FIGS. 8A to 8H are perspective views each illustrating an electronic device to which the invention is applied.

FIG. 8A illustrates a desktop, floor-stand or wall-hung display including a housing 301, a supporting base 302, a display portion 303, a speaker portion 304, a video input terminal 305, and the like. Such a display can be used as a display device for displaying information, such as for a personal computer, for TV broadcast reception, and for advertisement display. The method for manufacturing a semiconductor device of the invention can be applied to manufacture a pixel transistor in the display portion and a switching transistor in a peripheral driver circuit of such a display. Accordingly, the S value of the transistors can be reduced, leading to a display with higher operating speed and reduced power consumption.

Figure 8B:
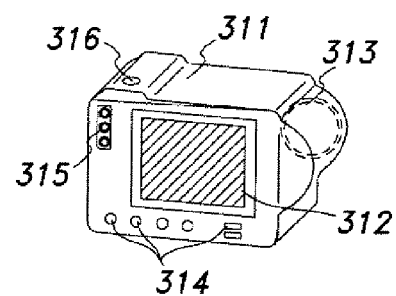

FIG. 8B illustrates a digital camera including a main body 311, a display portion 312, an image receiving portion 313, operating keys 314, an external connection port 315, a shutter button 316, and the like. The method for manufacturing a semiconductor device of the invention can be applied to manufacture a pixel transistor in the display portion and a switching transistor in a peripheral driver circuit of such a digital camera. Accordingly, the S value of the transistors can be reduced, leading to a digital camera with higher operating speed and reduced power consumption.

Figure 8C:
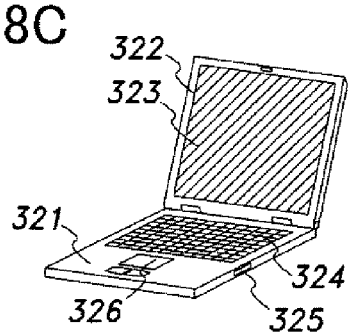

FIG. 8C illustrates a computer including a main body 321, a housing 322, a display portion 323, a keyboard 324, an external connection port 325, a pointing device 326, and the like. Note that the computer includes a so-called laptop computer equipped with a central processing unit (CPU), a recording medium, and the like, and a so-called desktop computer in which they are provided separately. The method for manufacturing a semiconductor device of the invention can be applied to manufacture a pixel transistor in the display portion and a switching transistor in a peripheral driver circuit of such a computer. Accordingly, the S value of the transistors can be reduced, leading to a computer with higher operating speed and reduced power consumption.

Figure 8D:
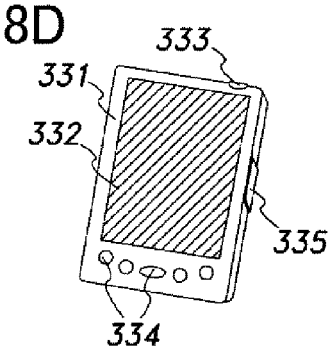

FIG. 8D illustrates a mobile computer including a main body 331, a display portion 332, a switch 333, operating keys 334, an infrared port 335, and the like. The method for manufacturing a semiconductor device of the invention can be applied to manufacture a pixel transistor in the display portion and a switching transistor in a peripheral driver circuit of such a mobile computer. Accordingly, the S value of the transistors can be reduced, leading to a mobile computer with higher operating speed and reduced power consumption.

Figure 8E:
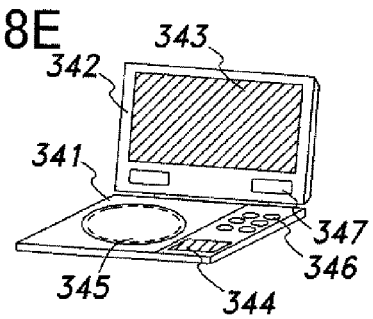

FIG. 8E illustrates a portable image reproducing device provided with a recording medium (specifically, a DVD reproducing device), which includes a main body 341, a housing 342, a first display portion 343, a second display portion 344, a recording medium (DVD or the like) reading portion 345, an operating key 346, a speaker portion 347, and the like. The first display portion 343 mainly displays image data while the second display portion 344 mainly displays character data. Note that the image reproducing device provided with a recording medium includes a home-use game machine and the like. The method for manufacturing a semiconductor device of the invention can be applied to manufacture a pixel transistor in the first and second display portions and a switching transistor in a peripheral driver circuit of such a portable image reproducing device. Accordingly, the S value of the transistors can be reduced, leading to a portable image reproducing device with higher operating speed and reduced power consumption.

Figure 8F:
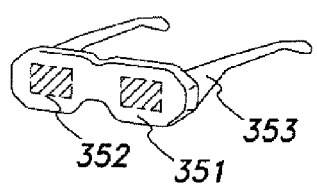

FIG. 8F illustrates a goggle-type display including a main body 351, a display portion 352, an arm portion 353, and the like. The method for manufacturing a semiconductor device of the invention can be applied to manufacture a pixel transistor in the display portion and a switching transistor in a peripheral driver circuit of such a goggle-type display. Accordingly, the S value of the transistors can be reduced, leading to a goggle-type display with higher operating speed and reduced power consumption.

Figure 8G:
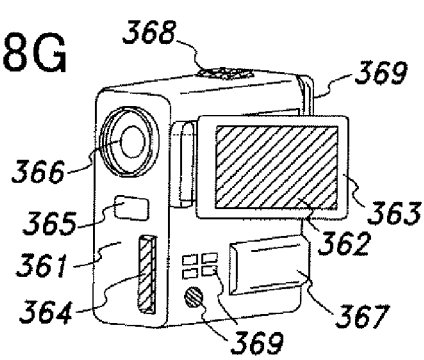

FIG. 8G illustrates a video camera including a main body 361, a display portion 362, a housing 363, an external connection port 364, a remote control receiving portion 365, an image receiving portion 366, a battery 367, an audio input portion 368, operating keys 369, and the like. The method for manufacturing a semiconductor device of the invention can be applied to manufacture a pixel transistor in the display portion and a switching transistor in a peripheral driver circuit of such a video camera. Accordingly, the S value of the transistors can be reduced, leading to a video camera with higher operating speed and reduced power consumption.

Figure 8H:
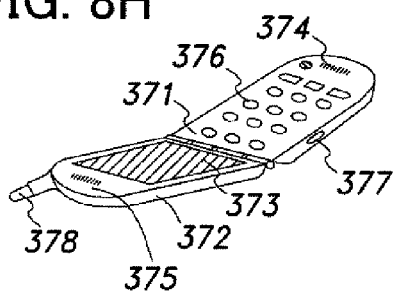

FIG. 8H illustrates a cellular phone including a main body 371, a housing 372, a display portion 373, an audio input portion 374, an audio output portion 375, an operating key 376, an external connection port 377, an antenna 378, and the like. The method for manufacturing a semiconductor device of the invention can be applied to manufacture a pixel transistor in the display portion and a switching transistor in a peripheral driver circuit of such a cellular phone. Accordingly, the S value of the transistors can be reduced, leading to a cellular phone with higher operating speed and reduced power consumption.

The display portions of the aforementioned electronic devices may be either of a self-light-emitting type in which a light-emitting element such as an LED and an organic EL element is used in each pixel, or of a type using another light source such as a backlight like in a liquid crystal display. In the case of the self-light-emitting type, no backlight is required and a display portion can be made thinner than that of a liquid crystal display.

The aforementioned electronic devices have been more used for a TV receptor, for displaying information distributed through a telecommunication line such as the Internet and CATV (cable TV), and in particular used for displaying moving image data. A display portion of a self-light-emitting type is suitable for displaying such moving images because a light-emitting material such as organic EL element exhibits a remarkably high response as compared to a liquid crystal. It is also suitable for time division driving. If a light-emitting material has a higher luminance with technological advances, it can be used for a front-type or rear-type projector by magnifying and projecting light including outputted image data by a lens and the like.

Since light-emitting parts consume power in a self-light-emitting display portion, information is desirably displayed so that the light-emitting parts may occupy an area as small as possible. Accordingly, in the case of adopting a self-light-emitting type for a display portion that mainly displays character data, such as the one of a portable information terminal, particularly the one of a cellular phone or an audio reproducing device, it is desirable to operate the devices so that light-emitting parts are used for displaying character data with non-light-emitting parts used as background.

As set forth above, the application range of the invention is so wide that it can be applied to electronic devices of all fields.

This application is based on Japanese Patent Application serial no. 2007-194093 filed with Japan Patent Office on Jul. 26, 2007, the entire contents of which are hereby incorporated by reference.

What is claimed is:

1. A method for manufacturing a semiconductor device, the method comprising:

forming a gate electrode over a substrate;

forming a gate insulating film over the gate electrode so that a projection portion is formed over the substrate by the formation of the gate electrode and the gate insulating film;
forming a semiconductor film comprising amorphous silicon over the gate electrode with the gate insulating film interposed therebetween;
crystallizing the semiconductor film by irradiating a laser light;
forming a resist over the semiconductor film after the crystallizing step;
exposing the resist with light through the substrate;
removing a portion of the resist which is exposed by the light;
adding an impurity element imparting one conductivity type to the semiconductor film using, as a mask, the resist which remains after the removal of the portion,
wherein the semiconductor film comprising amorphous silicon has a first portion over the gate electrode and a second portion adjacent to the first portion, and the first portion flows into the second portion in the crystallizing step, and
wherein after the crystallizing step, a thickness of the first portion is smaller than that of the second portion.

2. The method according to claim 1,
wherein after forming the gate electrode and before covering the gate electrode with the gate insulating film, sidewalls including an insulating material are formed so as to be in contact with side surfaces of the gate electrode.

3. The method according to claim 1,
wherein a thickness of the semiconductor film comprising amorphous silicon is equal to or greater than a height of the projection portion.

4. The method according to claim 1,
wherein the gate electrode has a tapered shape.

5. The method according to claim 1,
wherein at least one of an upper end portion and a bottom end portion of the gate electrode is rounded.

6. A method for manufacturing a semiconductor device, the method comprising:
forming a gate electrode over a substrate;
forming a gate insulating film over the gate electrode so that a projection portion is formed over the substrate by the formation of the gate electrode and the gate insulating film;
forming a semiconductor film comprising amorphous silicon over the gate electrode with the gate insulating film interposed therebetween;
crystallizing the semiconductor film by irradiating a laser light;
forming a resist over the semiconductor film after the crystallizing step;
exposing the resist with light through the substrate;
removing the resist partly so that an unexposed portion of the resist remains; and
selectively adding an impurity element imparting one conductivity type to the semiconductor film to form a source region and a drain region using the unexposed portion of the resist as a mask,
wherein the semiconductor film comprising amorphous silicon has a first portion over the gate electrode and a second portion adjacent to the first portion, and
wherein after the crystallizing step, a thickness of the first portion is smaller than that of the second portion.

7. The method according to claim 6,
wherein the second portion is not overlapped with the gate electrode.

8. The method according to claim 6,
wherein the first portion flows into the second portion in the crystallizing step.

9. The method according to claim 6,
wherein after forming the gate electrode and before covering the gate electrode with the gate insulating film, sidewalls including an insulating material are formed so as to be in contact with side surfaces of the gate electrode.

10. The method according to claim 6,
wherein a thickness of the semiconductor film comprising amorphous silicon is equal to or greater than a height of the projection portion.

11. The method according to claim 6,
wherein the gate electrode has a tapered shape.

12. The method according to claim 6,
wherein at least one of an upper end portion and a bottom end portion of the gate electrode is rounded.

13. The method according to claim 6,
wherein after the crystallizing step, a top surface of the first portion and a top surface of the second portion are coplanar to each other.

* * * * *